(12) United States Patent
Gan et al.

(10) Patent No.: US 7,302,663 B1
(45) Date of Patent: Nov. 27, 2007

(54) AUTOMATIC ANTENNA DIODE INSERTION FOR INTEGRATED CIRCUITS

(75) Inventors: Andy H. Gan, San Jose, CA (US); Nigel G. Herron, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 337 days.

(21) Appl. No.: 10/749,301

(22) Filed: Dec. 31, 2003

(51) Int. Cl.
*G06F 17/50* (2006.01)

(52) U.S. Cl. .................. 716/10; 716/2; 716/4; 716/17

(58) Field of Classification Search .................. 716/4, 716/1, 10, 11, 12, 14
See application file for complete search history.

(56) References Cited

U.S. PATENT DOCUMENTS

| | | | |
|---|---|---|---|
| 5,987,086 A * | 11/1999 | Raman et al. ................. | 716/1 |
| 6,006,024 A * | 12/1999 | Guruswamy et al. ......... | 716/12 |
| 6,209,123 B1 * | 3/2001 | Maziasz et al. ............... | 716/14 |
| 6,308,308 B1 * | 10/2001 | Cronin et al. .................. | 716/8 |
| 6,502,229 B2 * | 12/2002 | Lee et al. ...................... | 716/12 |
| 6,512,482 B1 | 1/2003 | Nelson et al. | |
| 6,557,155 B2 * | 4/2003 | Nagayoshi et al. ........... | 716/14 |
| 6,594,809 B2 * | 7/2003 | Wang et al. ................... | 716/10 |
| 6,792,578 B1 * | 9/2004 | Brown et al. ................. | 716/2 |
| 6,862,723 B1 * | 3/2005 | Wang et al. ................... | 716/13 |
| 6,934,924 B2 * | 8/2005 | Paul et al. ...................... | 716/11 |
| 7,073,148 B1 * | 7/2006 | Jenkins ........................ | 716/11 |
| 7,114,140 B2 * | 9/2006 | Ishikura ........................ | 716/8 |
| 2002/0066067 A1 * | 5/2002 | Wang et al. ................... | 716/11 |

OTHER PUBLICATIONS

U.S. Appl. No. 10/660,016, filed Sep. 11, 2003, Jenkins.

\* cited by examiner

*Primary Examiner*—Leigh M. Garbowski
(74) *Attorney, Agent, or Firm*—Robert Brush; Michael R. Hardaway

(57) ABSTRACT

Automatic antenna diode insertion for integrated circuits is described. In an example, at least a portion of an integrated circuit is defined by a block of standard cells selected from a cell library. A diode circuit is associated with at least one input port of the block of standard cells to form an augmented block. The augmented block is then implemented on a chip to form the integrated circuit. In another example, an integrated circuit is formed by associating a diode circuit with each primary input port of an embedded logic circuit that defines a portion of the integrated circuit. A remaining portion of the integrated circuit is defined by existing logic circuitry. Components of the embedded logic circuit are placed on a chip and conductors are routed connecting the components. The embedded logic circuit is then integrated with the existing circuitry onto the chip.

18 Claims, 5 Drawing Sheets

AUTOMATIC ANTENNA DIODE INSERTION FOR INTEGRATED CIRCUITS

FIELD OF THE INVENTION

One or more aspects of the present invention relate generally to design, layout, and fabrication of integrated circuits and, more particularly, to automatic antenna diode insertion for integrated circuits.

BACKGROUND OF THE INVENTION

Recent advances in integrated circuit (IC) technology have created a number of challenges in the design, layout, and fabrication of ICs at the chip level. The availability of sub-quarter micron silicon technologies has permitted the fabrication of millions of logic gates on a single chip. Functions that were previously implemented across multiple chips are now being integrated onto a single chip. Circuit characteristics such as resistance and coupling capacitance, previously second order effects, are now first order effects in the environment of sub-quarter micron silicon technologies. At the same time, the increasingly competitive environment forces manufacturers to bring their chips to market in a shorter time interval. Often, the initial design, layout, and mask fabrication can be very time consuming, even using electronic design automation (EDA) software. Even though the design process is highly automated, it is common to make manual changes to the final layout in order to achieve engineering change orders (ECOs), foundry re-targeting, and yield enhancement.

The design and layout of ICs consists of a number of steps that are performed in a pre-determined order. A general floor plan is first drawn up in which standard cells, taken from a library of cells, are laid out on the chip real estate. Each of these standard cells includes an electronic module or component. After the placement of the standard cells is determined, a routing step is performed in which electrical conductors are laid out or "routed" on the chip in order to interconnect the electronic modules with each other and with peripheral contact pads that are used to connect the IC with external circuitry. Notably, during circuit layout synthesis, routing typically involves the connection of N-Type and P-Type transistors and signal input/output ports using electrical connections and applicable layers according to the electrical connectivity of the circuit being laid out. The applicable layers for interconnection usually include polysilicon, diffusion, and metal. Routing has a profound effect on the quality of the final compacted cell layout. Bad routing can lead to increased layout errors, poor electrical performance, and low yields.

Following the placement and routing, a series of design rule checks (DRCs) are performed to determine whether any of a number of known design rules have been violated by the final placement and routing. One of these design rules involves so-called "antenna rule violations". Antenna rule violations are related to a phenomenon in which certain of the routed conductors act as antennas that attract and store an electrical charge that is developed during the manufacturing process, typically during plasma etching.

Plasma etching is a technique widely used in the fabrication of integrated circuits, wherein reactive ions are generated in an ion discharge and accelerated by an electrical field. These ions collide with the wafer surface carrying the semiconductor device being fabricated. The glow discharge used in plasma etching typically results in electrically charging some regions over the wafer surface. This charging can occur in a conductive layer region, for example at a polysilicon gate electrode formed upon the surface of the wafer. A conductive line connected to the gate can act as antenna to accumulate and store a charge, during the etching process. The conductive line facilitates the storage of more charge than would otherwise be stored by the gate electrode. The static charge stored in the conductive lines connected to the gate electrodes of transistors can ultimately discharge through the gate junction, thereby destroying the transistor as well as the IC during the fabrication process. In order to avoid possible damage to the input gates caused by electrostatic discharge due to the antenna effect, protective diodes are sometimes installed at the input gates of transistors. These diodes are referred to as "antenna diodes" since they provide a discharge path to ground for the charges stored by the offending conductive lines.

The "insertion" of antenna diodes in a circuit to correct an antenna rule violation is a very tedious and time-intensive task. The antenna diode insertion process often adds weeks to the design schedule. Conventionally, a layout engineer must run a DRC to identify antenna rule violations and, for each violation, study the layout to locate an area where an antenna diode may be inserted to correct the violation, and re-run the DRC to verify the violation has been removed and no new design rule violations have been introduced. The run-time of this process is very lengthy, often adding weeks or months to the design process. In addition, it is common that design modifications are required several times during the life of a particular product, which may require repetition of the tedious and lengthy antenna diode insertion process.

Accordingly, there exists a need in the art for automatic insertion of antenna diodes for integrated circuits that overcomes the lengthy run-time disadvantages associated with the conventional antenna diode insertion process.

SUMMARY OF THE INVENTION

An aspect of the invention relates to automatically inserting antenna diodes into an integrated circuit design. At least a portion of the integrated circuit design is defined by a block of standard cells selected from a cell library. A diode circuit is associated with each of at least one input port of the block of standard cells to form an augmented block. The augmented block is then implemented within the integrated circuit design. In one embodiment of the invention, after implementation, an antenna violation associated with an offending input port of the at least one input port is identified. At least one additional diode circuit is then associated with the offending input port. The augmented block is re-implemented in the integrated circuit design.

Another aspect of the invention relates to forming an integrated circuit on a chip. A diode circuit is associated with each of a plurality of primary input ports of an embedded logic circuit defining at least a portion of the integrated circuit. A remaining portion of the integrated circuit is defined by existing logic circuitry. Components of the embedded logic circuit are placed on the chip. Conductors are routed on the chip connected the components. The embedded logic circuit is then integrated with the existing circuitry onto the chip.

BRIEF DESCRIPTION OF THE DRAWINGS

Accompanying drawing(s) show exemplary embodiment(s) in accordance with one or more aspects of the invention; however, the accompanying drawing(s) should not be taken

DETAILED DESCRIPTION OF THE DRAWINGS

Automatic antenna diode insertion for integrated circuits is described. One or more aspects in accordance with the invention are described in terms a field programmable gate array (FPGA). While specific reference is made to an FPGA, those skilled in the art will appreciate that one or more aspects of the invention may be used with other types of standard cell integrated circuits, such as complex programmable logic devices (CPLDs), application specific integrated circuits (ASICs), and the like.

Figure 1:
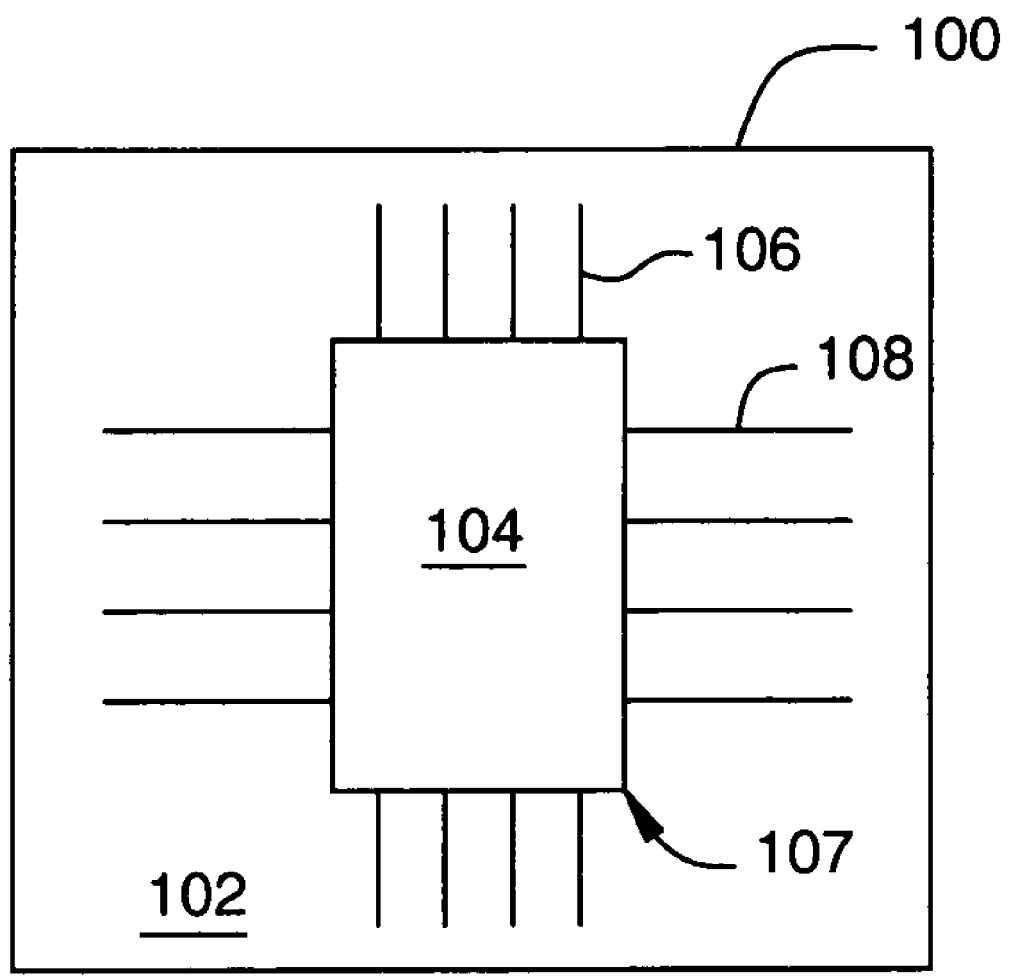
FIG. 1 depicts a block diagram of an exemplary embodiment of an integrated circuit comprising programmable logic and an embedded core region.

FIG. 1 is a block diagram depicting an exemplary embodiment of an integrated circuit 100 comprising programmable logic 102 and an embedded core 104 (also referred to herein as an "embedded block"). Pluralities of interconnect conductive lines 106 and 108 are shown as extending from an interface 107 of embedded core 104 and terminating within programmable logic 102. Accordingly, it should be appreciated that a portion of programmable logic 102 in integrated circuit 100, which may be a programmable logic device (PLD) such as an FPGA, is removed for providing space for embedded core 104. Embedded core 104 may be a microprocessor, a multi-gigabit transceiver (MGT), or other such devices known in the art.

Notably, conductive lines 106 and 108 may be formed at different elevations or layers with respect to a substrate of integrated circuit 100, as is well known in the art. It should be understood, however, that embedded core 104 need not necessarily be coupled to each metal layer of integrated circuit 100, and thus pluralities of conductive lines 106 and 108 may represent selected metal layers. In this manner, not all conductive lines 106 and 108 extending over embedded core 104 need to be terminated at interface 107.

Figure 2:
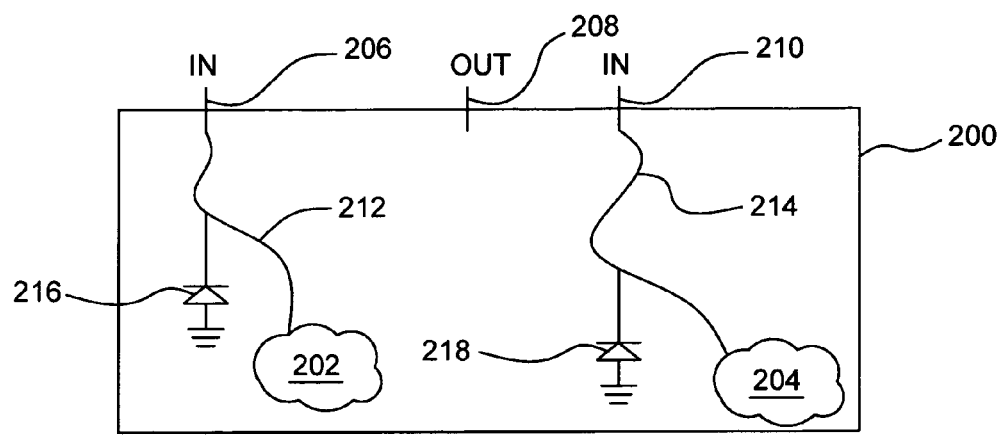
FIG. 2 is a block diagram depicting an exemplary embodiment of a portion of the embedded core of FIG. 1.

FIG. 2 is a block diagram depicting an exemplary embodiment of a portion 200 of embedded core 104 of FIG. 1. Portion 200 illustratively includes an input port 206, an input port 210, and output port 208, a logic portion 202, and a logic portion 204. Input ports 206, input port 210, and output port 208 facilitate connection of embedded core 104 to other circuitry, such as programmable logic 102. Logic portion 202 is coupled to input port 206 via a conductive line 212. Logic portion 204 is coupled to input port 210 via conductive line 214.

As previously discussed, conductive lines within an integrated circuit are laid out in a process referred to as "routing". Design software is normally used to effect automatic routing in order to form interconnections between components (e.g., logic portions 202 and 204) and connection pads (e.g., input ports 206 and 210). Even though routing is automatically formed, errors may be made that result in the violation of a series of standard design rules. Thus, following the routing step, a series of rule violation checks are performed to identify all layout problems. (referred to as design rule checking (DRC)) One of these design rules is the so-called antenna rule violation, wherein routed conductors may act as antennae to store potentially damaging electrical charges. For example, a design rule for antenna violations may be a threshold for the ratio between the total length of the conductive line and the area of the affected transistor gate. If the ratio exceeds the threshold, an antenna violation exists.

With respect to an embedded core, the majority of antenna violations are on the primary inputs to the embedded block. Thus, as discussed below, antenna diodes 216 and 218 may be automatically inserted onto input ports 206 and 210, respectively, during the place and route process, before design checking for antenna rule violations. Inserting antenna diodes onto the primary inputs of the embedded core during the place and route process greatly reduces the time and effort required to clean-up a design for tape-out and reduces costly iterations.

Figure 3:
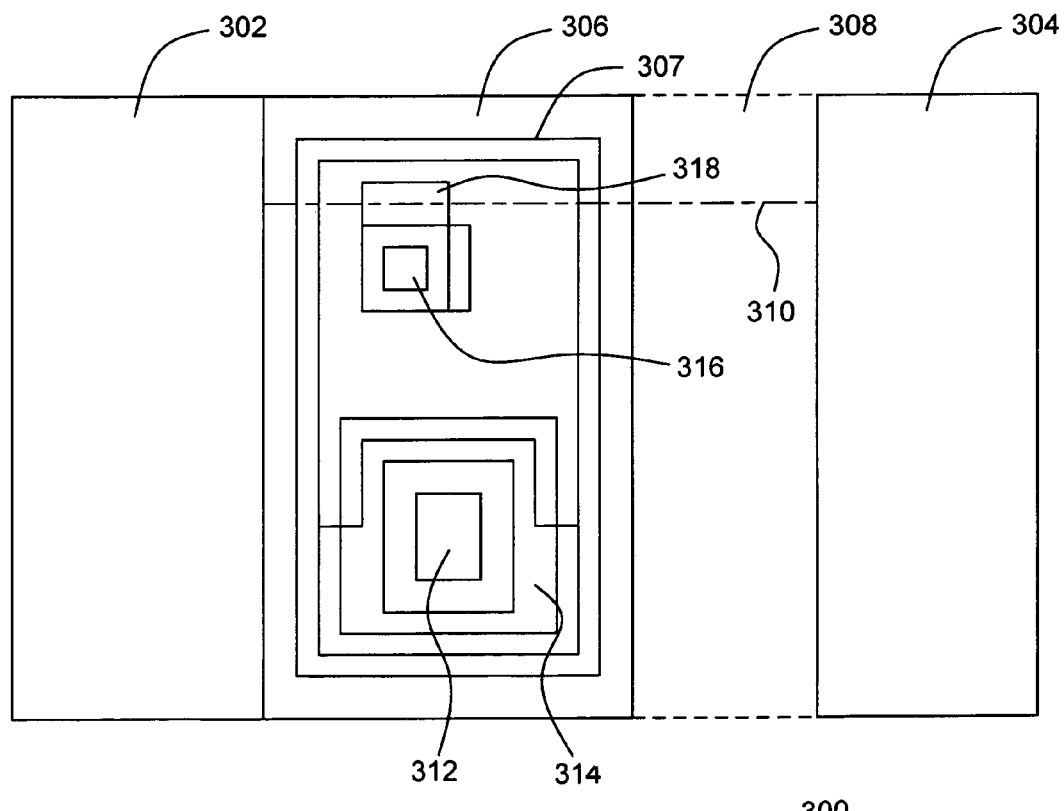
FIG. 3 is a block diagram depicting a more detailed view of a portion of the embedded core of FIG. 1.

FIG. 3 is a block diagram depicting a more detailed view of a portion 300 of embedded core 104 of FIG. 1. Portion 300 illustratively includes a cell 302, a cell 306, a cell 308, and a cell 304. Cells 302, 304, and 306 are standard cells, which may be part of a standard cell library. Each of the cells 302 and 304 includes a common electronic component or module that comprises an active or passive component or network forming part of embedded core 104. In particular, cell 306 comprises a diode 307 ("antenna diode cell 306"). As understood by those skilled in the art, as part of the initial placement and layout of embedded core 104, filler cells are inserted into the gaps between standard cells that are spaced apart on the chip. These filler cells are normally blank in that they do not contain nay active or passive components and thus, in a sense, represent wasted space. Cell 308 represents such a filler cell.

A conductive line 310 connects cell 302 and cell 304. With respect to FIG. 2, conductive line 310 may be conductive line 212 between input port 206 and logic portion 202. Diode 307 is coupled between conductive line 310 and ground in reverse-bias fashion. With respect to FIG. 2, diode 307 may be antenna diode 216 coupled to conductive line 212. Notably, diode 307 may be formed by a P-well in an N-type substrate, thus defining a P-N junction. Diode 307 is connected via a port 316 to a metal pad 318. Diode 307 is connected via a port 312 to a metal pad 314, which may be connected to ground. In order to connect diode 307 to conductive line 310, a metal layer may be formed over conductive line 310 and metal pad 318 during the manufacturing process.

Figure 4:
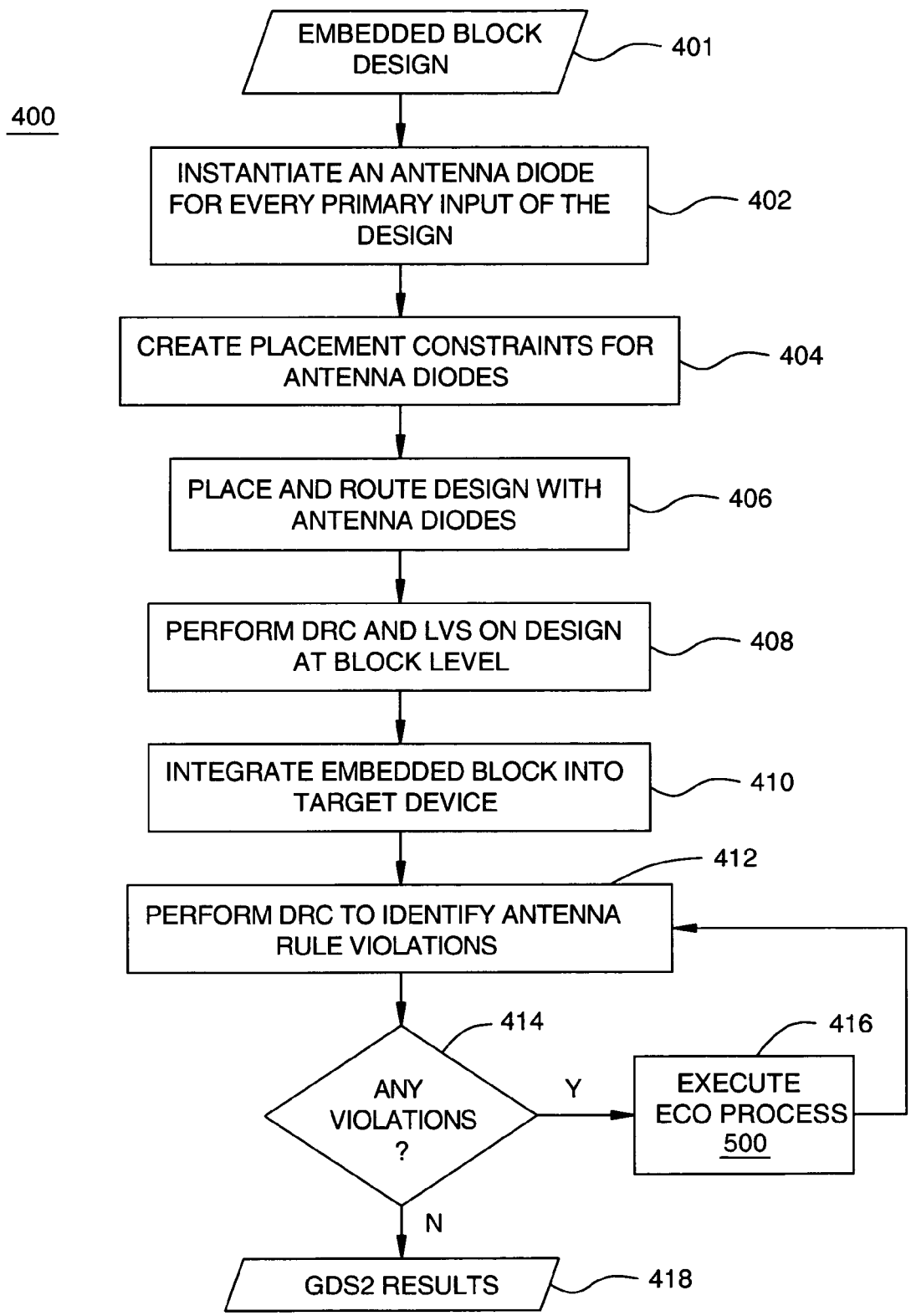
FIG. 4 is a flow diagram depicting an exemplary embodiment of a process for inserting antenna diodes in an integrated circuit having an embedded core.

FIG. 4 is a flow diagram depicting an exemplary embodiment of a process 400 for inserting antenna diodes in an integrated circuit having an embedded core. Process 400 begins by receiving an embedded block design 401. In an embodiment, embedded block design 401 represents a logic circuit that is to be embedded within existing logic circuitry of the integrated circuit. Embedded block design 401 is defined by standard cells that are part of a cell library. At step 402, an antenna diode is instantiated for at least one primary input of the embedded block design. In one particular embodiment of the invention, the antenna diodes are instantiated for every primary input of the embedded block design. A "primary input" is a top-level input to the embedded block that connects the embedded block to existing circuitry within the integrated circuit. In an embodiment, each antenna diode is a diode circuit represented by a standard cell in the cell library. The diode circuit is coupled to a conductive line associated with the respective primary input. In this manner, the antenna diodes are guaranteed to abut with other standard cells without causing design rule violations.

At step 404, placement constraints are created for the antenna diodes added to the design. The placement constraints insure that the antenna diodes are placed in operative proximity to the effected transistor gates associated with the primary inputs. That is, the placement constraints insure that the antenna diodes are placed sufficiently near the effected transistor gates such that excess charge may be dissipated during fabrication.

At step 406, design 401, which has been augmented with antenna diodes, is placed and routed. At step 408, DRC and layout-versus-schematic (LVS) processes are performed on design 401 at the block level. At step 410, embedded block design 401 is integrated with the existing circuitry onto the target device. At step 412, DRC is performed to identify antenna rule violations. Even though each primary input of the embedded block is coupled to an antenna diode, additional antenna rule violations may exist. For example, additional antenna diodes may be required if the metal connected to an affected transistor gate is long enough to build up more charge than a single diode can dissipate. The length of these wires is not known before integration step 410, so the number of diodes actually required cannot be known at the instantiation step 402.

At step 414, a determination is made as to whether embedded block design has any remaining antenna violations on the primary inputs. If additional antenna diodes are required, process 400 proceeds to step 416, where an engineering change order (ECO) process 500 is executed. ECO process 500 is discussed below with respect to FIG. 5. Process 400 then returns to step 412 to check for additional antenna rule violations. If additional antenna diodes are not required, process 400 ends and produces design results 418, such as GDS2 results.

Figure 5:
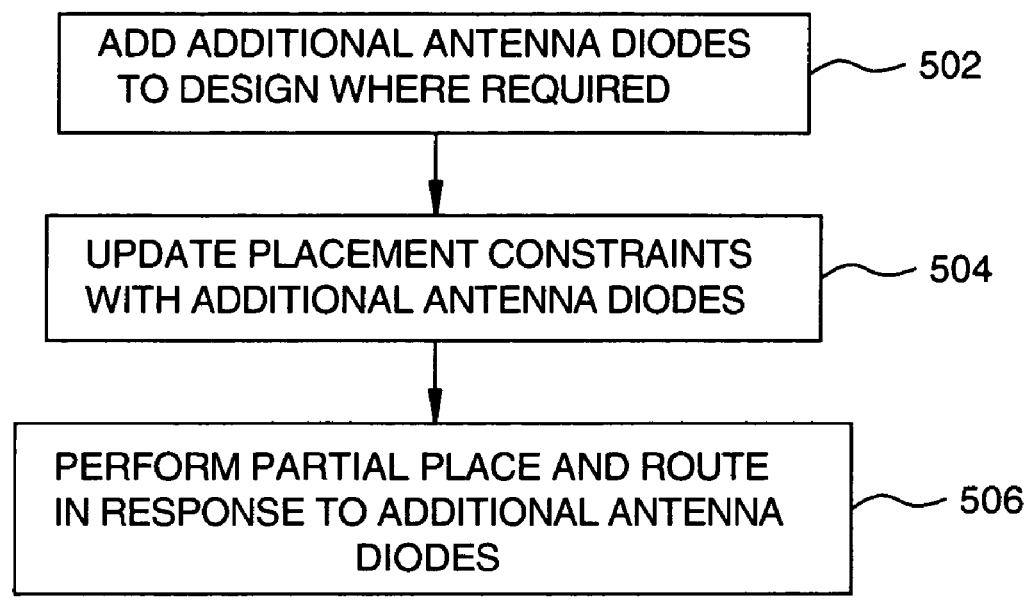
FIG. 5 is a flow diagram depicting an exemplary embodiment of an engineering change order process of FIG. 4.

FIG. 5 is a flow diagram depicting an exemplary embodiment of ECO process 500. Process 500 begins at step 502, where additional antenna diodes are added to the design where required. At step 504, the placement constraints created in step 404 of FIG. 4 are updated given the additional antenna diodes. At step 506, a partial place and route process is performed on the design in response to the additional antenna diodes. The partial place and route process preserves all original placements and routing defined during process 400, but removes filler cells to be replaced with the additional antenna diodes. For example, filler cell 308 in FIG. 3 can be replaced by one or more additional antenna diodes.

Figure 6:
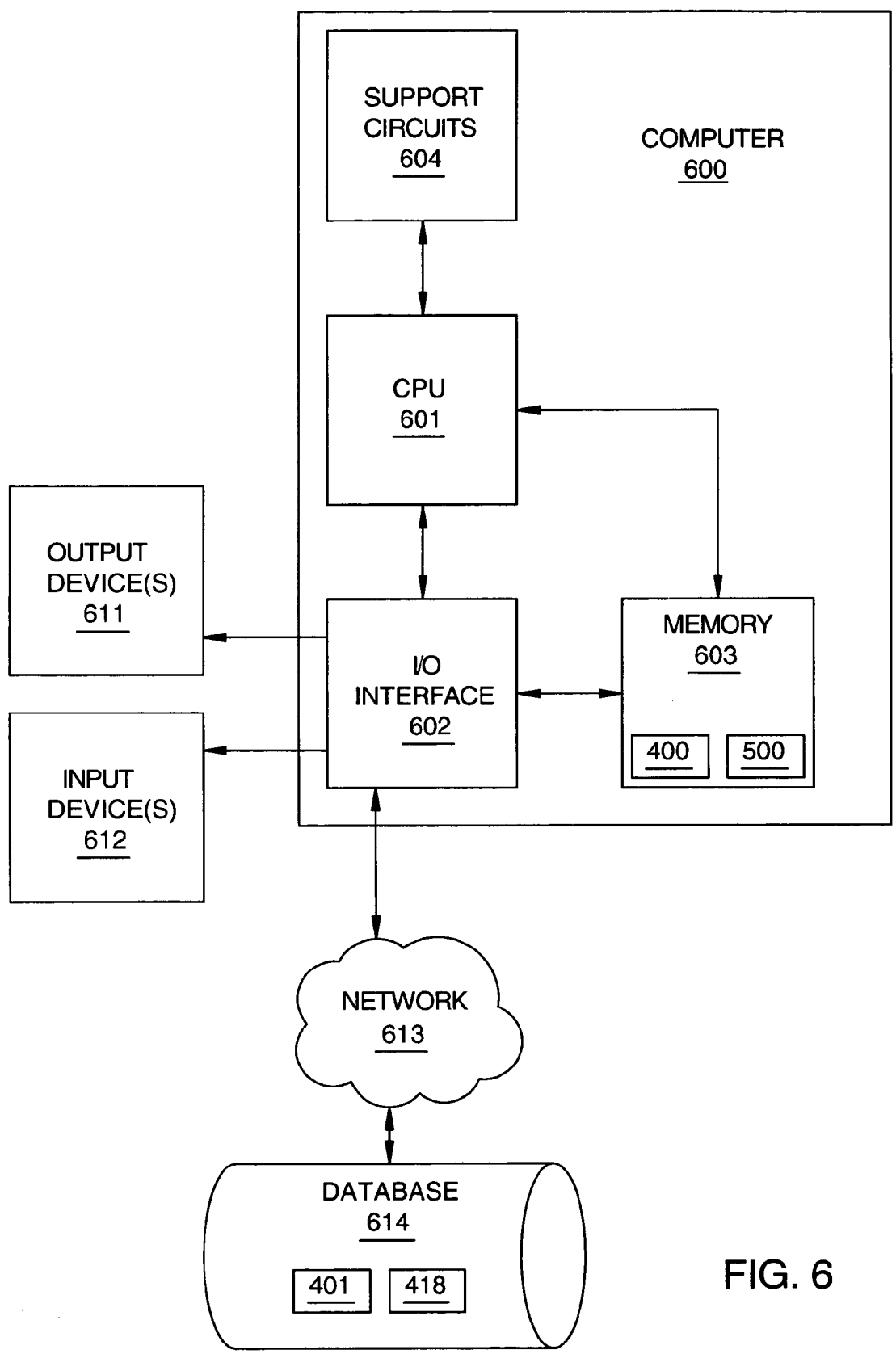
FIG. 6 is a block diagram depicting an exemplary embodiment of a computer suitable for implementing processes and methods described herein.

FIG. 6 is a block diagram depicting an exemplary embodiment of a computer 600 suitable for implementing processes and methods described above. Computer 600 includes a central processing unit (CPU) 601, a memory 603, various support circuits 604, and an I/O interface 602. CPU 601 may be any type of microprocessor known in the art. Support circuits 604 for CPU 602 include conventional cache, power supplies, clock circuits, data registers, I/O interfaces, and the like. I/O interface 602 may be directly coupled to memory 603 or coupled through CPU 601. I/O interface 602 may be coupled to various input devices 612 and output devices 611, such as a conventional keyboard, mouse, printer, display, and the like. In addition, I/O interface 602 may be coupled to a network 613 and may be adapted for communication with a database 614 to receive and transmit data, such as data files and the like. Notably, database 614 may store embedded block design 401 and EDA result 418, described above with respect to FIG. 4.

Memory 603 may store all or portions of one or more programs and/or data to implement the processes and methods described above. Although the invention is disclosed as being implemented as a computer executing a software program, those skilled in the art will appreciate that the invention may be implemented in hardware, software, or a combination of hardware and software. Such implementations may include a number of processors independently executing various programs and dedicated hardware, such as application specific integrated circuits (ASICs).

Computer 600 may be programmed with an operating system, which may be OS/2, Java Virtual Machine, Linux, Solaris, Unix, Windows, Windows95, Windows98, Windows NT, and Windows2000, WindowsME, and WindowsxP, among other known platforms. At least a portion of an operating system may be disposed in memory 603. Memory 603 may include one or more of the following random access memory, read only memory, magneto-resistive read/write memory, optical read/write memory, cache memory, magnetic read/write memory, and the like, as well as signal-bearing media as described below. Memory 603 may store all or a portion of antenna diode insertion process 400 or ECO process 500, described above with respect to FIGS. 4 and 5.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Automatic antenna diode insertion for integrated circuits is described. Antenna diodes are inserted on one or more of the primary inputs of a cell-based embedded block as standard cells during the place and route process. This allows the vast majority of antenna violations to be fixed in hours, rather than weeks. The antenna violations may be corrected at the block level and in parallel with other design activities. Since the antenna diode is a standard cell, the antenna diode is guaranteed to abut with all other standard cells without causing new DRC violations.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of automatically inserting antenna diodes for an integrated circuit design, comprising:
   selecting a block of standard cells defining at least a portion of the integrated circuit design, said block having at least one primary input port, each said at least one primary input port being a top-level input to said block connecting said block to additional circuitry;
   associating a diode circuit with each said at least one primary input port of said block of standard cells;
   laying out components of said block of standard cells and said diode circuit associated with each said at least one input port; and
   routing conductors for connecting said components and connecting each said at least one primary input port to said associated diode circuit.

2. The method of claim 1, wherein said diode circuit associated with each said at least one input port comprises a standard cell selected from said cell library.

3. The method of claim 2, further comprising:
   creating placement constraint data for said diode circuit associated with said at least one input port.

4. The method of claim 3, wherein said laying out step comprises placing said diode circuit associated with said at least one input port in accordance with said placement constraint data.

5. The method of claim 4, further comprising:
   responsive to said steps of laying out and routing, identifying an antenna violation associated with an offending input port of said at least one input port;
   associating at least one additional diode circuit with said offending input port to form an augmented block; and
   re-implementing said augmented block within said integrated circuit design.

6. The method of claim 5, further comprising repeating said identifying step, said associating at least one additional diode step, and said re-implementing step a plurality of times.

7. The method of claim 5, wherein said re-implementing step comprises:
   replacing at least one filler cell of said augmented block with said at least one additional diode circuit.

8. The method of claim 5, wherein said identifying step comprises:
   determining a ratio of an area of a conductor associated with said offending input port to an area of a gate of a transistor associated with said offending input port; and
   comparing said ratio to a threshold.

9. The method of claim 1, further comprising:
   responsive to said steps of laying out and routing, identifying an antenna violation associated with an offending input port of said at least one input port;
   associating at least one additional diode circuit with said offending input port to form an augmented block; and
   re-implementing said augmented block within said integrated circuit design.

10. The method of claim 1, wherein said at least one input port comprises all input ports of said block.

11. An apparatus for automatically inserting antenna diodes for an integrated circuit design, at least a portion of the integrated circuit being defined by a block of standard cells selected from a cell library, the apparatus comprising:
    means for associating a diode circuit with at least one input primary port of said block of standard cells, each said at least one primary input port being a top-level input to said block connecting said block to additional circuitry;
    means for laying out components of said block of standard cells and said diode circuit associated with each said at least one primary input port; and
    means for routing conductors for connecting said components and connecting each said at least one primary input port with said associated diode circuit.

12. The apparatus of claim 11, further comprising:
    means for identifying an antenna violation associated with an offending input port of said at least one input port;
    means for associating at least one additional diode circuit with said offending input port to form an augmented block; and
    means for re-implementing said augmented block within said integrated circuit design.

13. A method of forming an integrated circuit, comprising:
    associating a diode circuit with each of a plurality of primary input ports of an embedded logic circuit defining at least a portion of the integrated circuit, a remaining portion of the integrated circuit defining existing logic circuitry;
    laying out components of said embedded logic circuit;
    routing conductors connecting said components
    integrating said embedded logic circuit with said existing logic circuitry onto a chip to form the integrated circuit
    responsive to said integrating, identifying an antenna violation associated with an offending primary input port of said plurality of primary input ports; and
    associating at least one additional diode circuit with said offending primary input port.

14. The method of claim 13, further comprising:
    re-integrating said embedded logic circuit with said existing logic circuitry onto said chip.

15. The method of claim 13, wherein said components of said embedded logic circuit, said diode circuit associated with each of a plurality of primary input ports, and said additional diode circuit are composed of standard cells selected from a cell library.

16. The method of claim 15, further comprising replacing at least one filler cell of said embedded logic circuit with said at least one additional diode circuit.

17. The method of claim 13, wherein said integrated circuit is a programmable logic device and at least a portion of said existing logic circuitry comprises programmable logic blocks.

18. The method of claim 17, wherein said embedded logic circuit is a processor.

* * * * *